United States Patent
Fusco

[19]

[11] Patent Number: 5,974,241
[45] Date of Patent: Oct. 26, 1999

[54] TEST BENCH INTERFACE GENERATOR FOR TESTER COMPATIBLE SIMULATIONS

[75] Inventor: Gene T. Fusco, Fort Collins, Colo.

[73] Assignee: LSI Logic Corporation, Milpitas, Calif.

[21] Appl. No.: 08/877,117

[22] Filed: Jun. 17, 1997

[51] Int. Cl.⁶ .................................................. G06F 9/455
[52] U.S. Cl. ........................................................ 395/500.03
[58] Field of Search ............................. 364/578; 395/500, 395/183.06, 500.03, 500.06, 500.07, 500.41, 500.42; 324/512, 526, 527; 702/57, 58, 81, 82, 84, 117–126

[56] References Cited

U.S. PATENT DOCUMENTS

| | | | |
|---|---|---|---|
| 5,257,268 | 10/1993 | Agrawal et al. | 371/27 |
| 5,323,401 | 6/1994 | Maston | 371/27 |
| 5,434,805 | 7/1995 | Iwasaki | 364/580 |
| 5,446,742 | 8/1995 | Vahabi | 371/27 |
| 5,475,624 | 12/1995 | West | 364/578 |
| 5,710,934 | 1/1998 | Bona et al. | 395/800 |
| 5,812,416 | 10/1998 | Gupte et al. | 364/490 |

*Primary Examiner*—Kevin J. Teska
*Assistant Examiner*—Dan Fiul

[57] ABSTRACT

A method for simulating an integrated circuit design that automatically generates an interface between a test bench and a device design for simulation. The method determines that the signal format and timing information of the test bench conforms to the constraints of some target ATE. If the information conforms, an array of buffers is created to provide the interface. Each of the buffers are defined according to the signal timing information. The interface is then incorporated into a test bench stimuli generator and the design is simulated. In this manner, the method allows for the generation of a simulation that can be then reproduced on any target ATE.

11 Claims, 2 Drawing Sheets

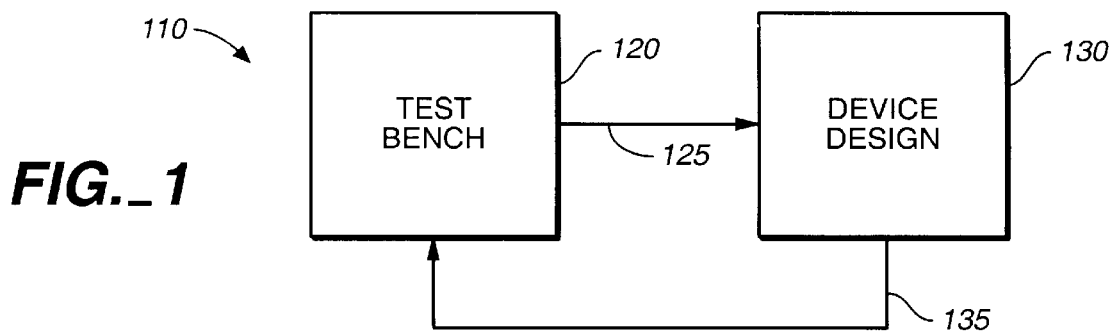
FIG._1
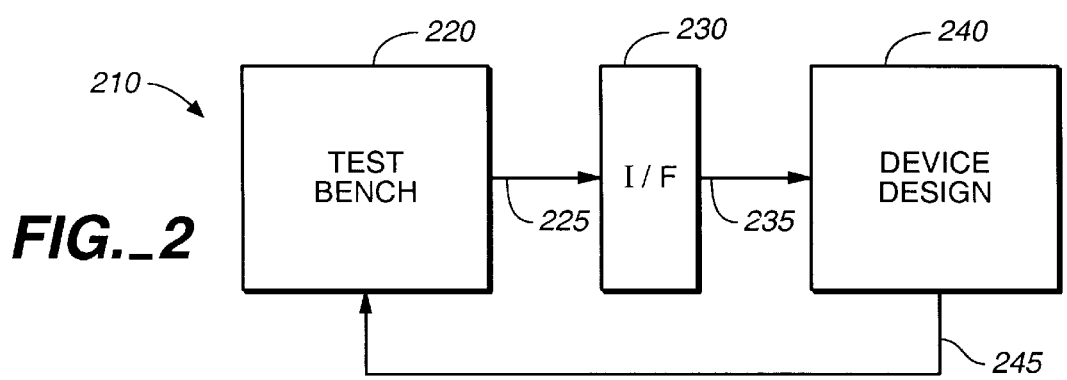
FIG._2
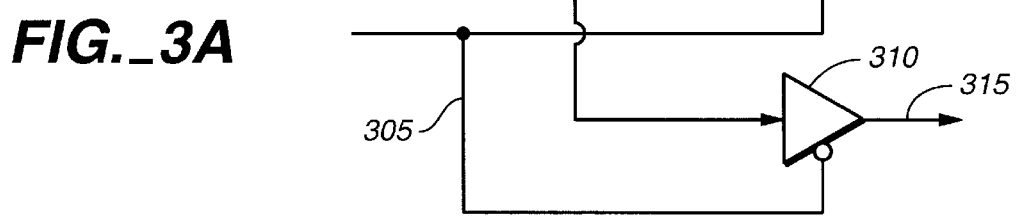
FIG._3A
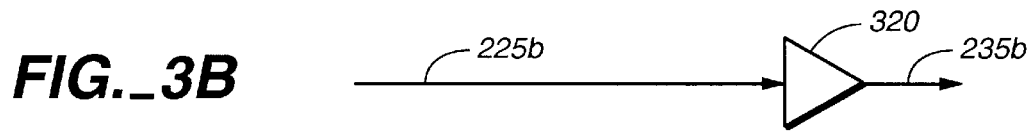
FIG._3B

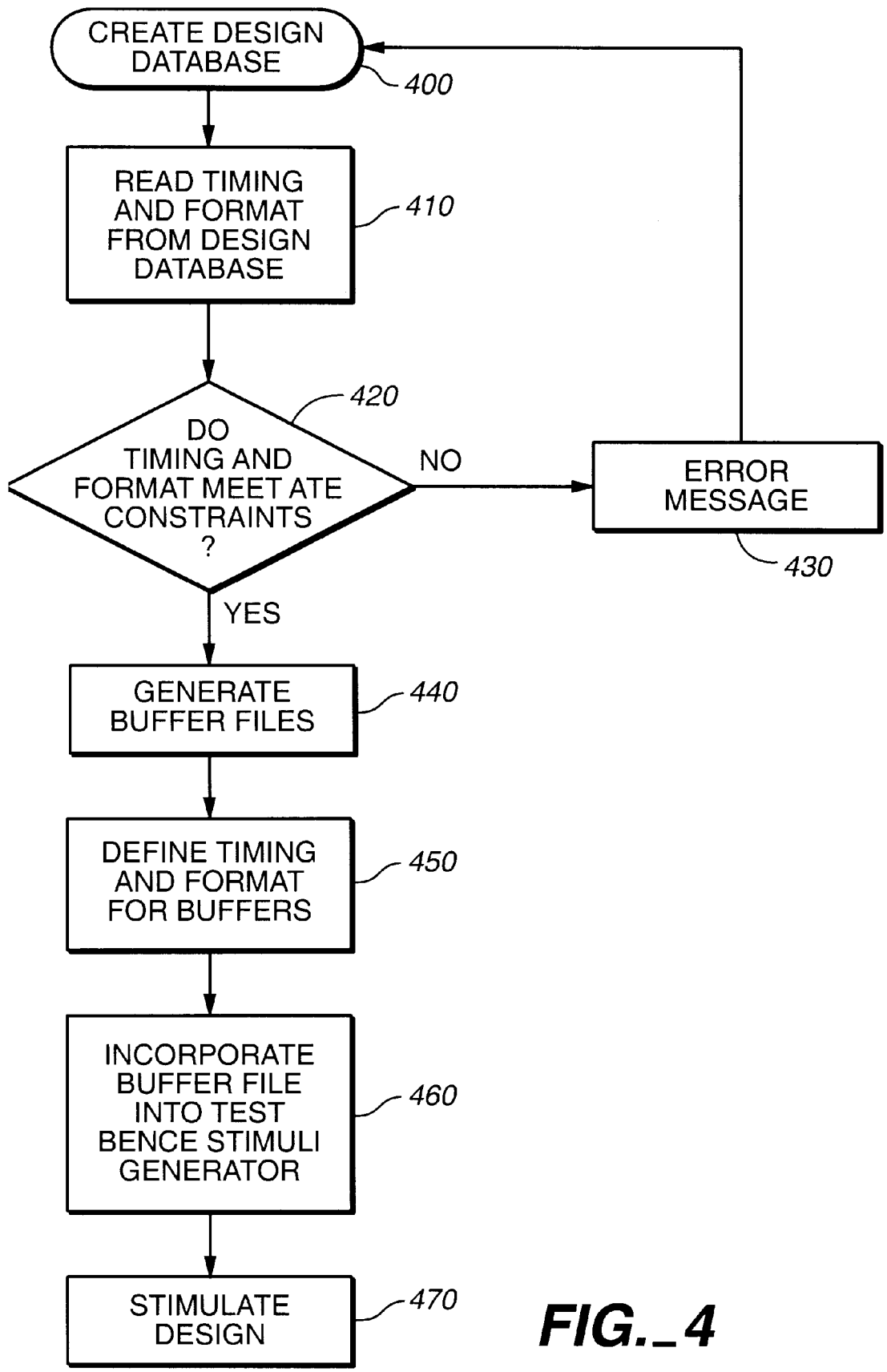
FIG._4

TEST BENCH INTERFACE GENERATOR FOR TESTER COMPATIBLE SIMULATIONS

FIELD OF THE INVENTION

The present invention relates to integrated circuit design and more particularly to providing vectors to test equipment that accurately represent an integrated circuit design simulation.

BACKGROUND OF THE INVENTION

Design automation for integrated circuits, particularly application specific integrated circuits (ASICs), is becoming increasingly important as the integrated circuits become more complex and dense. Design modeling, layout and verification of these integrated circuits, for example, are becoming more mathematically complex and time intensive. Any reduction in the complexity or time intensity would favorably reduce the period between device design and prototype.

A typical design process begins by entering the integrated circuit design in a hardware description language, such as VHDL. An industry standard CAE platform is used, such as Mentor Graphics Design Architect, Synopsys Design Analyzer or Cadence Verilog. The designer of the integrated circuit usually enters the design of the integrated circuit's surrounding environment or architecture. The surrounding environment or architecture is known as a "test bench." The test bench and integrated circuit together form a "system."

To conceptually illustrate the description above, reference is made to FIG. 1. A system 110 is shown which includes a test bench 120 and a device design 130. Test bench 120 and device design 130 interact with signals provided through signal paths 125 and 135. System 110 of FIG. 1 is implemented as software for use on a CAE platform.

Using the "Test Bench" methodology allows the designer to simulate a new device while using the capabilities of the simulator to generate input stimulus based on programmed simulation data and feedback from the device under test. The simulation is performed by creating a test bench that imitates the behavior of the system in which the device being designed will operate. As the simulation runs, input stimulus is applied to the device and outputs are monitored. During the simulation run, input stimulus to the device and output signals from the device are recorded in a simulation output file. Once the simulation has ended this simulation output file is analyzed to ensure tester timing and format constraints have not been violated as well as to ensure the device performed functionally as expected.

After analysis, if no errors are detected, test vectors are extracted from the simulation results. The design is subsequently implemented as a physical integrated circuit device. The physical device is tested by using automatic test equipment (ATE). The ATE tests the physical device by applying signals to the device according to the extracted test vectors and comparing output states from the device against expected output states specified by the test vectors extracted from the simulation output.

An inherent problem with the above described process is that the simulators used to simulate designs offer more flexibility with respect to signal formats and timings than the ATE used for the physical device test. Specifically, a simulation is a software representation of the real world, and with no restrictions is capable of creating signal formats that are beyond the ability of ATE to reproduce. In a manufacturing test environment it is important for the ATE to be able to reproduce the waveforms exactly as they were simulated to ensure that the test will operate correctly and produce the expected results.

To illustrate, all ATE have a physical limitation to their maximum test frequency or clock rate. Also, ATE usually support a limited set of signal formats or a maximum number of input transitions in a period. In contrast, the simulator is not limited in these ways, and arbitrary signal formats can be created and frequencies well beyond the capabilities of ATE can be simulated.

The lesser flexibility of the ATE compared to the CAE often causes problems for integrated circuit designers. For example, if a designer defines a signal with jitter for a simulation input stimulus, that jitter may cause inaccurate test vector extraction although the simulation operated as expected. This is a problem when considered in light of the amount of time simulations require. A typical ASIC design can require anywhere from a few hours to a few days of simulation run time on a computer or work station. Errors uncovered by the analysis in many cases will require changes be made to the simulation input stimulus and subsequent resimulation. If errors are not caught at this stage and test vectors are extracted from the resultant output of the simulation it could be several weeks before the vectors are used by the ATE to test the physical device. If the test vectors are inaccurate, then the ATE may fail good parts or pass bad parts. Hence, a new cycle of simulation extraction and ATE testing must be done. This time loss is unacceptable to most ASIC customers.

To overcome this problem, a common requirement is that the timings and signal formats that comprise the input stimulus for the simulation must conform to specifications defined by a target ATE that will be used to test the actual physical device. A simulation from such conforming stimulus is said to be "tester compatible."

In order to generate tester compatible stimulus, the designer must manually define the test bench/device interface to produce signals that conform to the restricted timing constraints of the targeted ATE. Since simulation takes a considerable amount of time, it would be beneficial for designers to know that their test benches will produce correct signals before investing the time and resources to simulate the device.

In many cases IC design packages provide a device database that requires the user to define the signal formats and timings. This database is checked against ATE specifications to ensure that the timing information is tester compatible. In addition, timing and format information from this database is used to verify the results of the simulation after it is performed.

A need exists for automatically providing test vectors that accurately represent simulation stimulus while conforming to ATE constraints. The present invention meets this need.

SUMMARY OF THE INVENTION

The present invention includes a method for simulating an integrated circuit design that automatically generates an interface between an existing test bench and a device design for simulation. The method determines that the signal format and timing information defined in a design database conforms to the requirements and limitations of a target automatic test equipment (ATE). If the information conforms, an array of buffers is created to provide the interface. Each of the buffers operating characteristics are defined according to the signal type. For example, the buffers are defined to be for either a bidirectional or input pin of the device design. In addition, the buffer definitions also contain the signal timing and format information.

The interface is then incorporated into a test bench stimuli generator and the design is simulated. In this manner, the invention allows for the simulation of a device that can be then tested on an ATE while ensuring that the simulation stimulus conformed to that ATE's specific constraints.

Numerous other advantages and features of the present invention will become readily apparent from the following detailed description of the invention and the embodiments thereof, from the claims and from the accompanying drawings in which details of the invention are fully and completely disclosed as a part of this specification.

BRIEF DESCRIPTION OF THE DRAWINGS

In the drawings,

FIG. 1 illustrates a simulation system;

FIG. 2 illustrates a simulation system including the present invention;

FIGS. 3A and 3B illustrate buffer devices according to the present invention; and FIG. 4 is a flow chart including the present invention.

DETAILED DESCRIPTION OF THE PREFERRED EMBODIMENT

While this invention is susceptible of embodiment in many different forms, there is shown in the drawings and will be described herein in detail a specific embodiment thereof with the understanding that the present disclosure is to be considered as an exemplification of the principles of the invention and is not to be limited to the specific embodiment described.

The present invention reads signal format and timing information from a design database. This information is subjected to a set of rule checks based on the selected ATE that will be used to test the device. The designer will be informed of errors found in this step, and be allowed to make changes to the data until all rules pass. At this point, the database contains "tester compatible" timing information. The type and number of constraints allowed and tested for is determined by the ATE. An example of a set of signal format and timing information in a generic design database format is as follows:

Tester Period: 100 ns

Signal: Input_A
   Type: Input
   Format: Return-to-Zero
   Rising Edge time: 25 ns
   Falling Edge time: 75 ns Signal: Input_B
   Type: Bidirectional
   Format: Non-Return-to-Zero
   Rising Edge time: 30 ns
   Falling Edge time: 35 ns
   Out-to-In time: 60 ns
   In-to-Out time: 50 ns From that information, the invention will create a test bench interface that produces simulated signals conforming to that information and the constraints of the ATE. As illustrated in FIG. 2, a system 210 includes a test bench 220, a test bench interface (I/F) 230 and a device design 240. Test bench 220 provides signals to test bench interface 230 via signal path 225. Test bench interface 230 provides ATE compatible signals to device design 240 via signal path 235. Device design 240 provide signals to test bench 220 via signal path 245.

A file containing a number of buffer devices using components and syntax recognized by the desired simulator tool are then generated. These buffer devices correspond to each input and bidirectional pins of device design 240, and are included in test bench interface 230. FIG. 3A and 3B illustrate test bench interface 230 in more detail. Buffer devices 300, 310 and 320 are coupled to signal paths 225a and 225b as shown to receive signals from test bench 220. Signal paths 225a and 225b are included in signal path 225 shown in FIG. 2. Outputs of buffer devices 300, 310, and 320 are provided on signal paths 235a, 315, and 235b, respectively. Signal paths 235a and 235b are included in signal path 235 shown in FIG. 2. Test bench 220 also provides to buffers 300 and 310 an enable signal via a lead 305.

Buffer devices 300, 310, and 320 are used to model the signal interaction between test bench interface 230 and input or bi-directional (I/O) pins of device design 240. As illustrated in FIG. 3A, buffer devices 300 and 310 are an arrangement for bidirectional signals of device design 240. Illustrated in FIG. 3B is a single buffer which corresponds to an input signal for device design 240. For example, since buffers 300 and 310 are associated to a bi-directional pin, signal paths 235a and 315 are checked to determine whether the pin (of device design 240 ) is in an input or an output mode.

The pin is in an output mode (Device driving data) when a strong logic value is detected on signal path 235a and signal path 315 is providing a high impedance state, i.e., buffer 310 is "off." In this mode, output enable signal is inactive. The pin is in an input mode (Test Bench driving data) when a strong value is detected on signal path 315 (buffer 310 is "on" and the enable signal on lead 305 is active). Further related details are disclosed in U.S. patent application Ser. No. 08/299,395, assigned to the assignee of the present invention, entitled "Integrated Circuit I/O Pad-Cell Modeling," which is incorporated herein by reference.

The present invention utilizes the simulator's (CAE) language to define the signal format and timing properties of each buffer as called for in the design database. An example of a generated buffer file in a generic simulator code is as follows:

```
module Test_Bench_Interface
    (Input_A,Input_A_sig,Bidir_A,Bidir_a_sig,
Bidir_A)_enb);
    output Input_A;
    input Input_A_sig;
    inout Bidir_B;
    inout Bidir_B_sig;
    input Bidir_B_enb;
    Input_A_buffer (Input_A_sig,Input_A)
    {
        if (Bidir_A_sig = 1 during period)
        {
            set (Input_A = 1 at 25 ns into period); # Rising Edge time
            set (Input_A = 0 at 75 ns into period); # Falling Edge time
        }
        else
        {
            set (Input_A = 0 at 0 ns into period);
        }
    }
Bidir_B_buffer (Bidir_A_sig,Bidir_A_enb,Bidir_A)
{
    state data;
    if (Bidir_A_sig = 1 during period)
    {
```

```
        set (data = 1 at 30 ns into period); # Rising Edge time
    }
    if (Bidir_A_sig = 0 during period)
    {
        set (data = 0 at 35 ns into period); # Falling Edge time
    }
    if (Bidir_A_enb = 1 during period)
    {
        set (Bidir_A_enb = Z at 50 ns into period); # In-to-Out time
    }
    If (Bidir_A_enb = 0 during period)
    {
        set (Bidir_A_enb = data at 60 ns into period); # Out-to-In time
    }
}
end module.
```

When completed, this file is included in the designer's test bench stimulus generator. With this incorporation, signals generated by the test bench will be routed through the appropriate buffer which in turn will generate a signal that conforms to the corresponding device design pin format and timing definition. Simulation stimulus is recorded from the connection between test bench interface 230 and the device input or bidirectional pin of device design 240.

The operation of the present invention will be explained with reference to FIG. 4. Step 400 creates the design database. This step preferably includes initial planning of the design. The design is then entered using standard CAE/CAD tools known in the industry, such as those from Cadence Design Systems, Mentor Graphics, Synopsis and Viewlogic. A design database is created from entering the design. Included in this database are signal format and timing information such as presented above.

At step 410, the signal format and timing information of the design database is read. A determination is made at step 420 whether the signal format and timing information conforms to the target ATE. For example, the timing information may include "jitter." However, this signal timing with a certain amount of jitter may not be detected when test vectors are extracted. The test vector extraction is determined in part by the target ATE timing constraints. In addition, the targeted ATE may only support signals that have certain formats, e.g., NRZ, NRO, RZ, RO and SBC. If the design database signal format is, to illustrate a combination of two or more of the listed formats above then such format would not be ATE compatible.

If the signal format or timing information is determined not to conform to the targeted ATE constraints, then an error message can be provided to the user at step 430. The error message preferably provides the user with information regarding the error, e.g., which signal definition does not conform to ATE timing or format constraints. The user then will correct the error and re-create the design database as indicated in FIG. 4. If the signal format and timing information do conform, then step 440 is performed. In step 440, an array of buffers as shown in FIG. 3 are created. In step 450, each of the buffers are defined, for example, as described above. At step 460, the buffer file is included in the testbench stimuli generator. Finally, at step 470, the design is simulated. During simulation, the simulator outputs various values, including both input stimulus and resulting net/node values (both internal and external).These simulation results are stored in an output file for subsequent processing by other design test tools, such as test vector extractors.

In more detail, after design entry the user can optionally perform static timinganalysis (using a tool such as VeriTime, available from Cadence Design Systems, Inc. which is located in San Jose, Calif.), as well as generate input stimulus waveforms for use in subsequent simulation. After such stimulus waveform creation, the user can optionally perform functional simulations. The user can then perform several gate-level simulations using the same simulator (CAE). After simulation, power analysis can optionally be performed. The simulation results are then validated, preferably with a design test tool, and a net checking tool can then be run. Subsequent layout, post-layout verification and prototype phases are standard in the industry.

One important aspect of the present invention is that signal format and timing information are automatically translated into the simulation tool's stimulus generation program. This ensures that simulation waveforms are produced in agreement with the timings and formats defined by the ATE. This removes a level of duplication where the designer must enter this information in a database as well as defining it in their simulation program.

The present invention is particularly advantageous in the design process of an integrated circuit since the present invention can be implemented with the constraints of the any ATE. For example, many ATEs can have different clock frequencies or different signal formats than those discussed above. Thus, the present invention essentially has universal application in integrated circuit design processes.

Numerous variations and modifications of the embodiment described above may be effected without departing from the spirit and scope of the novel features of the invention. It is to be understood that no limitations with respect to the specific device illustrated herein are intended or should be inferred. It is, of course, intended to cover by the appended claims all such modifications as fall within the scope of the claims.

I claim:

1. A method of designing an integrated circuit comprising the steps of:
   determining whether a design test bench conforms to predetermined constraints; and
   creating an interface between the test bench and a device design.

2. A method of simulating a design comprising the steps of:
   creating a test bench;
   creating a device design; and
   creating an interface between the test bench and the device design, wherein the interface is automatically generated from signal information included in the test bench to provide simulator compatible stimuli.

3. The method of claim 1 wherein the step of creating the interface utilizes tester compatible timing information.

4. The method of claim 1 wherein the step of creating the interface includes the step of generating a file that contains devices using components and syntax recognized by a simulator tool.

5. The method of claim 1 wherein the devices are buffers.

6. The method of claim 4 wherein the devices are used to model signal interaction between the interface and the device design.

7. The method of claim 2 wherein the step of creating the interface utilizes tester compatible timing information.

8. The method of claim 2 wherein the step of creating the interface includes the step of generating a file that contains devices using components and syntax recognized by a simulator tool.

9. The method of claim 2 wherein the devices are buffers.

10. The method of claim 8 wherein the devices are used to model signal interaction between the interface and the device design.

11. A device for designing an integrated circuit comprising:
   means for determining whether a design test bench conforms to predetermined constraints; and
   means for creating an interface between the test bench and a device design.

* * * * *